(12) United States Patent
Tuominen (10) Patent No.: US 6,991,966 B2
(45) Date of Patent: Jan. 31, 2006

(54) METHOD FOR EMBEDDING A COMPONENT IN A BASE AND FORMING A CONTACT

(75) Inventor: Risto Tuominen, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 0 days.

(21) Appl. No.: 10/502,340

(22) PCT Filed: Jan. 28, 2003

(86) PCT No.: PCT/FI03/00064

§ 371 (c)(1),
(2), (4) Date: Sep. 23, 2004

(87) PCT Pub. No.: WO03/065778

PCT Pub. Date: Aug. 7, 2003

(65) Prior Publication Data

US 2005/0124148 A1    Jun. 9, 2005

(30) Foreign Application Priority Data

Jan. 31, 2002  (FI) .................................. 20020190

(51) Int. Cl.
*H01L 21/44* (2006.01)
(52) U.S. Cl. ...................... 438/118; 438/119; 438/106
(58) Field of Classification Search .................... None
See application file for complete search history.

(56) References Cited

U.S. PATENT DOCUMENTS

| | | | |
|---|---|---|---|
| 3,192,307 A | 6/1965 | Lazar | |
| 4,246,595 A | 1/1981 | Noyori et al. | |
| 5,306,670 A | 4/1994 | Mowatt et al. | |
| 5,432,677 A * | 7/1995 | Mowatt et al. | 361/719 |
| 6,038,133 A | 3/2000 | Nakatani et al. | |
| 6,154,366 A | 11/2000 | Ma et al. | |
| 6,271,469 B1 | 8/2001 | Ma et al. | |
| 6,292,366 B1 | 9/2001 | Platt | |
| 6,475,877 B1 | 11/2002 | Saia et al. | |
| 6,489,685 B2 | 12/2002 | Asahi et al. | |
| 6,538,210 B2 | 3/2003 | Sugaya et al. | |
| 6,625,880 B2 * | 9/2003 | Nabemoto et al. | 29/830 |
| 2002/0117743 A1 | 8/2002 | Nakatani et al. | |
| 2002/0185303 A1 | 12/2002 | Takeuchi et al. | |
| 2003/0068852 A1 | 4/2003 | Towle et al. | |
| 2003/0137045 A1 | 7/2003 | Sugaya et al. | |

FOREIGN PATENT DOCUMENTS

WO    WO-00/21344 A1    4/2000

* cited by examiner

*Primary Examiner*—Dung A. Le
(74) *Attorney, Agent, or Firm*—Birch, Stewart, Kolasch & Birch, LLP (57) ABSTRACT

The invention includes a method, in which at least some of the semiconductor components forming part of an electronic circuit are embedded in a base, such as a circuit board, during the manufacture of the base. Thus, the base structure is basically manufactured around the semiconductor component. According to the invention, at least one conductive pattern and through holes for the semiconductor components are made in the base. Thereafter, the semiconductor components are placed in the holes in alignment with the conductive pattern. The semiconductor components are attached to the structure of the base, and one or more conductive pattern layers are made in the base in such a way that at least one conductive pattern forms an electrical contact with the contact areas of the surface of the semiconductor component.

21 Claims, 11 Drawing Sheets

METHOD FOR EMBEDDING A COMPONENT IN A BASE AND FORMING A CONTACT

The present invention relates to a method for embedding one or more components in a base and for forming contacts in them.

The bases that are processed using the methods to which the present invention relates are used as bases for electrical components, typically semiconductor components and particularly microcircuits, in electronic products. The task of the base is to provide a mechanical attachment base for the components and the necessary electrical connections to the other components on the base and outside the base. The base can be a circuit board, so that the method that is the object of the invention is closely related to circuit-board manufacturing technology. The base can also be some other base, for example, a base used for packaging a component or components, or the base of an entire functional module.

Circuit-board manufacturing technologies differ from microcircuit manufacture in, among other things, the fact that the substrate used in microcircuit manufacturing technologies is a semiconductor material, whereas the base material of a circuit board is an insulator. Microcircuit manufacturing technologies are also typically considerably more expensive than circuit-board manufacturing technologies.

Circuit-board manufacturing technologies differ from packaging techniques in that packaging techniques are intended to form a package around a semiconductor component, which will facilitate its handling. The surface of a package of a semiconductor component has contact parts, typically protrusions, which allow the packaged component to be easily installed on a circuit board. A semiconductor package also contains conductors, through which voltage can be connected to the actual semiconductor, connecting the protruding contact parts outside the package to the contact areas on the surface of the semiconductor component.

However, the packages of components manufactured using conventional technologies take up a considerable amount of space. The miniaturization of electronic devices has led to an attempt to eliminate the packaging of semiconductor components. For this purpose, the so-called flip-chip technology for instance, has been developed, in which a semiconductor component without a package is assembled directly onto the surface of the circuit board. There are, however, many difficulties in flip-chip technology. For example, problems can arise with the reliability of connections, especially in applications in which mechanical stresses arise between the circuit board and the semiconductor component. Mechanical stresses must be evened by adding a suitable underfill between the chip and the circuit board. This procedure slows down the process and increases manufacturing costs. Stresses arise particularly in applications in which a flexible circuit board is used and the circuit board is flexed strongly.

An object of the invention is to create a method, by means of which unpacked microcircuits can be attached to a base and provided with contacts reliably but economically.

The invention is based on embedding the semiconductor components, or at least some of them, in a base, such as a circuit board, during the manufacture of the base, whereby part of the base structure is manufactured around the semiconductor components. According to the invention, at least one conductive pattern is first manufactured in the base, as are through holes for the semiconductor components. After this, the semiconductor components are placed in the holes, in alignment with the conductive pattern. The semiconductor components are attached to the structure of the base and one or more layers of conductive patterns are manufactured in the base, in such a way that at least one conductive pattern forms an electrical contacts with the contact areas on the surface of the semiconductor component.

Considerable advantages are gained with the aid of the invention. This is because, with the aid of the invention, a circuit board can be manufactured with the semiconductor components embedded inside it. The invention also makes it possible to manufacture a small and reliable component package around a component.

The invention also permits a large number of embodiments, which provide significant additional advantages.

For example, by means of the invention, the component's packaging stage, the circuit board's manufacturing stage, and the assembly and contact-making stage of the semiconductor components can be combined to form a single totality. The combination of the various process stages brings important logistic benefits and permits the manufacture of a smaller and more reliable electronic module. There is the further advantage that such a manufacturing method can largely exploit circuit board manufacturing and assembly technologies that are in general use.

The composite process according to a preferred embodiment of the invention is, in its totality, simpler than, for example, manufacturing a circuit board and using flip-chip technology to attach the components to the circuit board. By means of such preferred embodiments, the following advantages over the conventional solution are obtained:

Soldering is not required to form contacts with the components. Instead, an electrical contact can be manufactured by growing conductors on top of the contact areas of a semiconductor component. This means that there is no need to use molten metal to connect the components, so that compounds are not formed between metals. Compounds between metals are generally brittle; thus, reliability is improved compared to connections made by soldering. Particularly in small connections, the brittleness of the metal compounds in the connections causes great problems. According to an exemplary embodiment, it is possible to achieve clearly smaller structures in a solderless solution than in soldered solutions. The solderless contact-making method also has the advantage that high temperatures are not required to form contacts. A lower process temperature permits greater choice when selecting other materials of the circuit board, the component package, or the electronics module. In the method, the temperature of the circuit board, the component, and the conductive layer directly connected to the component can be kept in the range 20–85° C. Higher temperatures, for example, of about 150° C., may be needed only when hardening (polymerizing) any polymer films used. However, the temperature of the baseboard and the components can be kept under 200° C. during the entire process. In the method, it is also possible to use polymer films, which are hardened in other ways than due to the effect of a high temperature, for example, chemically, or by electromagnetic radiation, such as ultraviolet light. In such an exemplary embodiment of the invention, the temperature of the baseboard and the components can be kept under 100° C. during the entire process.

Because the use of the method permits the manufacture of smaller structures, the components can be spaced more closely. The conductors between the components can then also be shorter while the electrical properties of the electronic circuit improve, for example, by reducing losses, interference, and delay times.

The method also permits the manufacture of three-dimensional structures, as the bases and the components embedded in the bases can be assembled on top of each other.

In the method, it is also possible to reduce the interfaces between different metals.

The method permits a lead-free process.

The invention also permits other preferred embodiments. In connection with the invention, flexible circuit boards, for instance, can be used. Further, the process permits circuit boards to be assembled on top of each other.

With the aid of the invention, it is also possible to manufacture extremely thin structures, in which the semiconductor components are, despite its thinness, entirely protected within a base, such as a circuit board.

Because the semiconductor components can be placed entirely inside the circuit board, the joints between the circuit board and the semiconductor components are mechanically durable and reliable.

In the following, the invention is examined with the aid of examples and with reference to the accompanying drawings.

FIG. 1 shows a series of cross-sections of one process according to an exemplary embodiment of the invention.

FIG. 2 shows a series of cross-sections of a second process according to an exemplary embodiment of the invention.

FIG. 3 shows a series of cross-sections of a third process according to an exemplary embodiment of the invention.

Figure 1A:
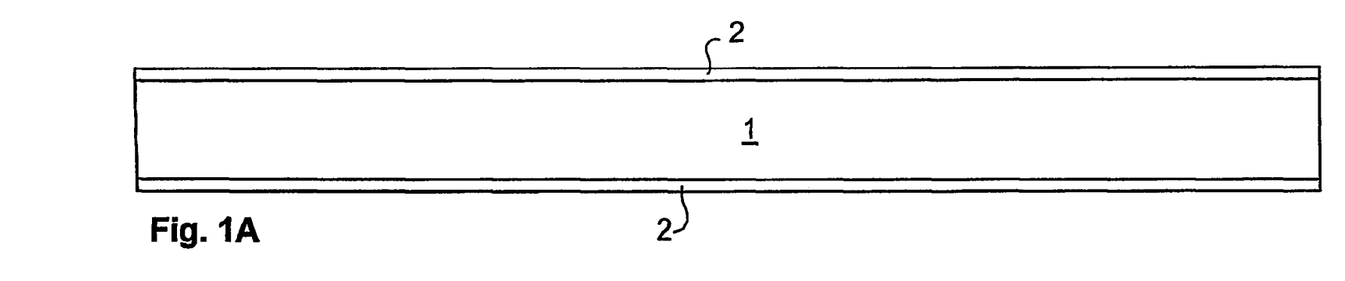

The series of illustrations shown in FIG. 1 show one possible process according to the invention. In the following, the process of FIG. 1 is examined in stages:

Stage A (FIG. 1A):

In stage A, a suitable baseboard 1 is selected for the circuit-board manufacturing process. The baseboard 1 can be, for example, a glass-fibre reinforced epoxy board, such as an FR4-type board. In the example process, the baseboard 1 can thus be an organic board, as the example process does not require high temperatures. A flexible and cheap organic board can thus be selected for the baseboard 1. Typically a board that is already coated with a conductive material 2, usually copper, is selected for the baseboard 1. Of course, an inorganic board can also be used.

Figure 1B:
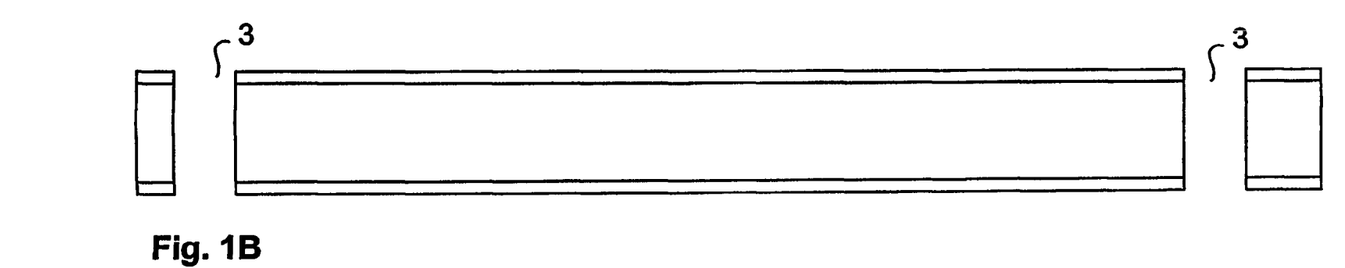

Stage B (FIG. 1B):

In stage B, through holes 3 are made in the baseboard for electrical contacts. The holes 3 can be made, for example, with some known method used in circuit-board manufacture, such as mechanical drilling.

Figure 1C:
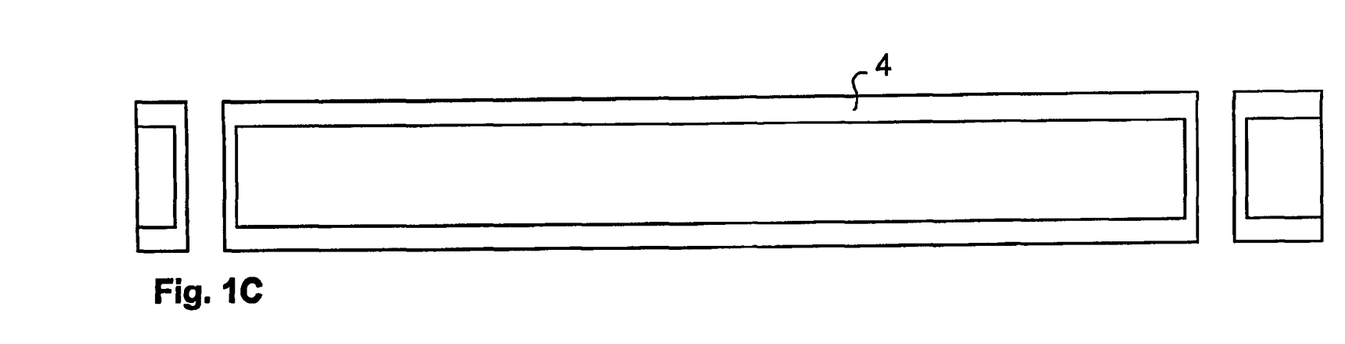

Stage C (FIG. 1C):

In stage C, metal 4 is grown into the through holes made in stage B. In the example process, the metal 4 is also grown on top of the circuit board, thus also increasing the thickness of the conductive layer 2.

The conductive material 4 to be grown is copper, or some other material with sufficient electrical conductivity. Copper metallizing can take place by coating the holes with a thin layer of chemical copper and then continuing the coating using an electrochemical copper-growing method. Chemical copper is used in an exemplary embodiment, as it will surface on top of a polymer and act as an electrical conductor in electrochemical coating. The metal can thus be grown using a wet-chemical method, so that the growth is cheap.

Alternatively, the conductive layer 4 can be made, for example, by filling the through holes with an electrically conductive paste.

Figure 1D:
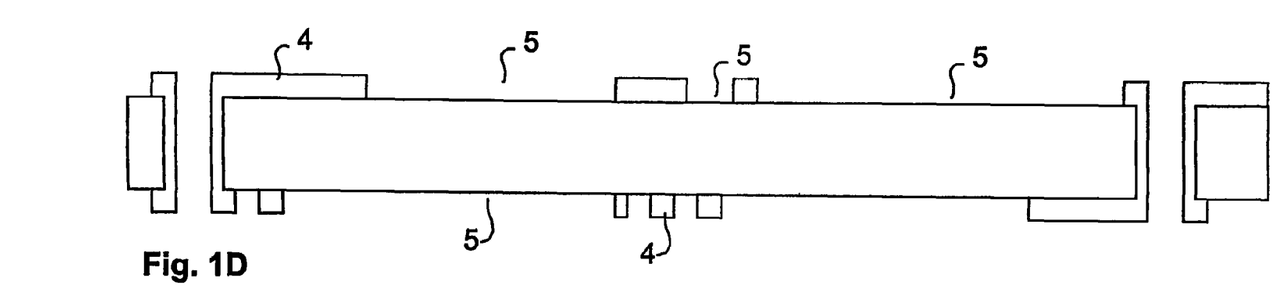

Stage D (FIG. 1D):

In stage D, the conductive layer on the surface of the circuit board is patterned. This can be done by utilizing generally known circuit-board manufacturing methods. The patterning of the conductive layer is aligned, for example, on the holes made in stage B.

The manufacture of the conductor pattern can take place, for example, by laminating, on the surface of the metal 4, a photolithographic polymer film on which the desired conductive pattern is formed by directing light through a patterned mask. After exposure, the polymer film is developed when the desired areas are removed from it and the copper 4 under the polymer is revealed. Next, the copper revealed under the film is etched away, leaving the desired conductive pattern. The polymer acts as a so-called etching mask, and openings 5, at the foot of which the baseboard of the circuit board is revealed, are formed in the metal layer 4. After this, the polymer film is also removed from on top of the copper 4.

Figure 1E:
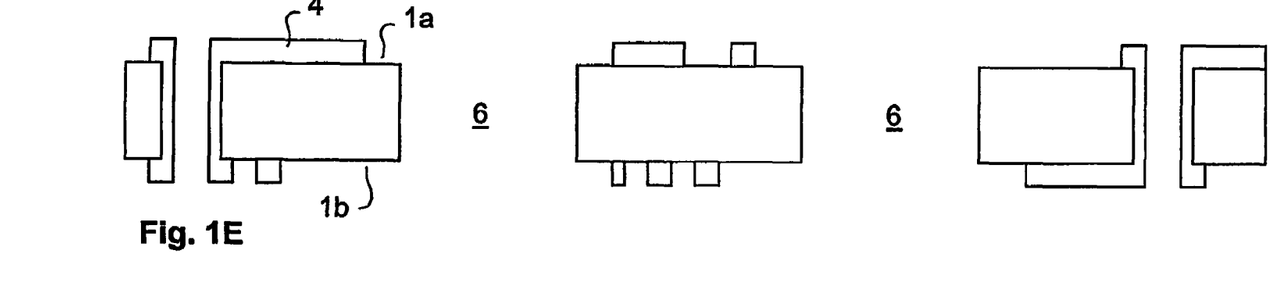

Stage E (FIG. 1E):

In stage E, holes 6 are made in the baseboard for the microcircuits. The holes extend through the entire baseboard, from the first surface 1a to the second surface 1b. The holes may be made, for example, by mechanically milling by means of a milling machine. The holes 6 can also be made, for example, by stamping. The holes 6 are aligned relative to the conductive patterns 4 of the circuit board. The holes 3 made during stage B can also be used to aid alignment, but then too the alignment is relative to the conductive patterns 4, as the conductive patterns 4 have a specific position in relation to the holes 3.

Figure 1F:
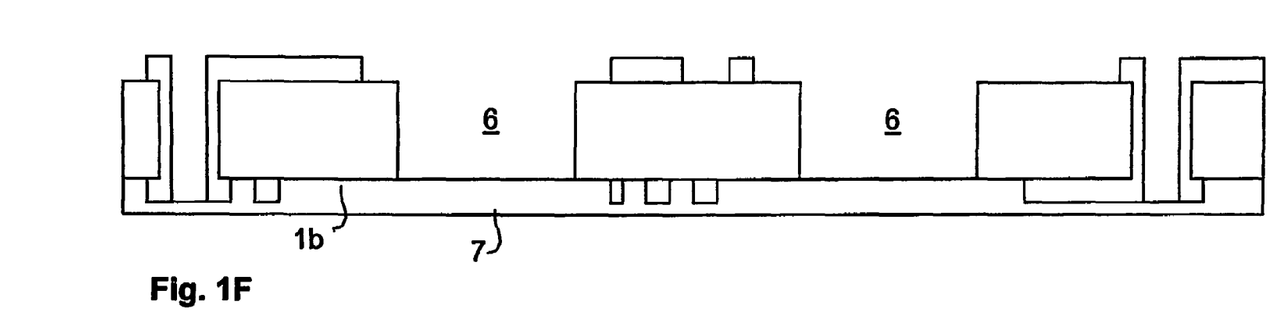

Stage F (FIG. 1F):

In stage F, tape 7 or something similar is laminated over the holes 6. The tape 7 is laminated by stretching it straight over the hole 6 along the second surface 1b of the baseboard. The tape is intended to hold the components to be assembled in the next stage in place, until the components have been secured to the baseboard using the final attachment method.

Figure 1G:
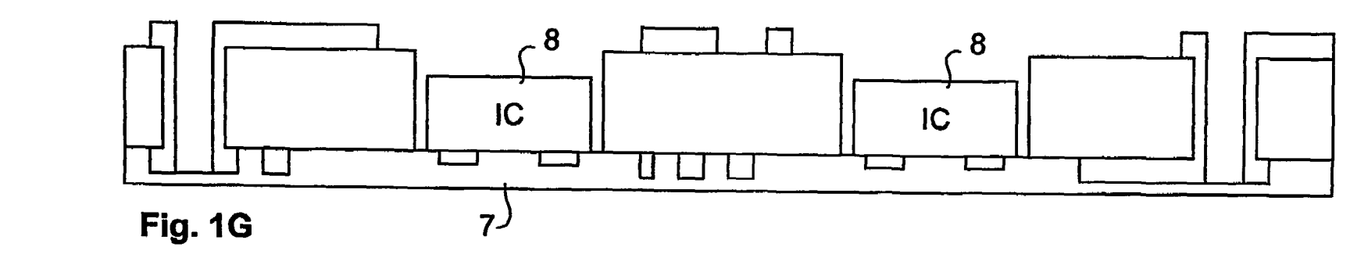

Stage G (FIG. 1G):

In stage G, the microcircuits 8 are assembled in the holes 6, from the side of the first surface 1a of the baseboard. Assembly can take place using a precision assembly machine, the microcircuits 8 being aligned relative to the conductive patterns of the circuit board. As in stage E, the holes made in stage B can be used to aid alignment.

The microcircuits 8 are assembled in such a way that they adhere to the adhesive surface of the tape 7 in the 'bottoms' of the holes 6.

Figure 1H:
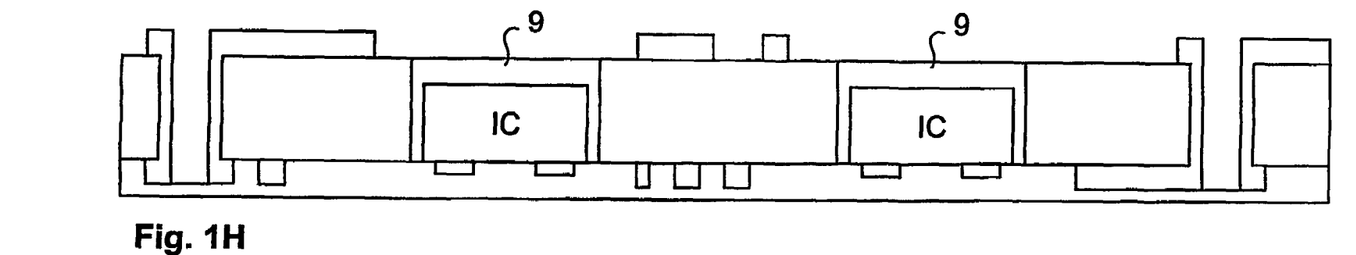

Stage H (FIG. 1H):

In stage H, the microcircuits 8 are attached to the baseboard of the circuit board by using a filler substance 9 to fill the holes made for the microcircuits. In an exemplary embodiment, this stage is carried out by spreading casting epoxy into the holes and on top of the microcircuits 8, from the side of the first surface (1a) of the circuit board. The epoxy is smoothed with a spatula and is hardened by curing in an autoclave.

Figure 1I:
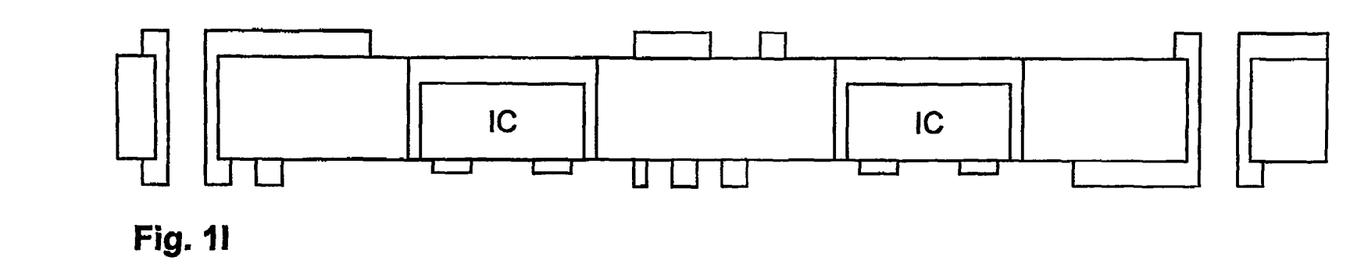

Stage I (FIG. 1I):

In stage I, the tape laminated in stage F is removed.

Figure 1J:
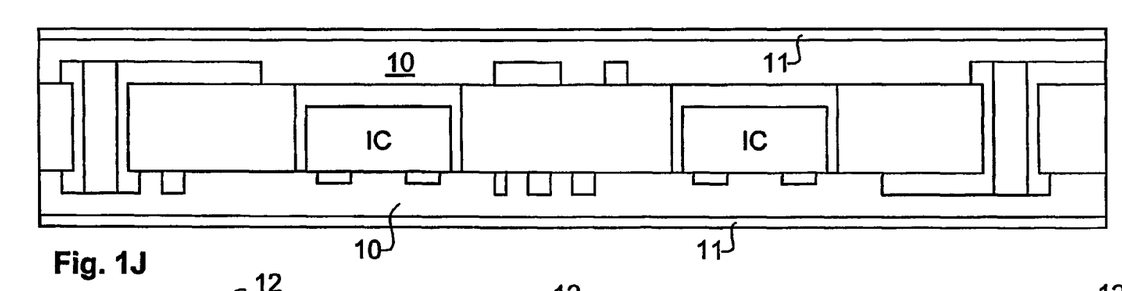

Stage J (FIG. 1J):

In stage J, a polymer film 10 is formed on the surface of the circuit board, followed by a thin metal coating 11 on top of the polymer film. The film is preferably formed on both surfaces of the circuit board, but at least on the second surface (1b) of the circuit board.

In an exemplary embodiment, stage J is carried out by laminating a thin polymer film (e.g., c. 40 $\mu$m) on the surface of the circuit board, on top of which is a layer of copper (e.g., c. 5 $\mu$m). Lamination takes place with the aid of pressure and heat. In the example process, the film is thus an RCC (Resin Coated Copper) foil.

The polymer film can also be made by, for example, spreading polymer in a liquid form on the circuit board. Thus lamination is not essential in stage J. What is essential is that an insulating layer, typically a polymer film, is made on the circuit board, which contains the embedded components, particularly embedded microcircuits. The polymer film itself can be, according to the embodiment, a filled or unfilled polymer film. The polymer film can also be coated with metal, but this is not essential, as the conductive surface can also be made later, on top of a polymer layer that is already attached to the circuit board.

Stage J makes it possible to use conventional manufacturing methods and work stages used in circuit board manufacture in the example process and nevertheless to be able to embed microcircuits and other components inside the circuit board.

Figure 1K:
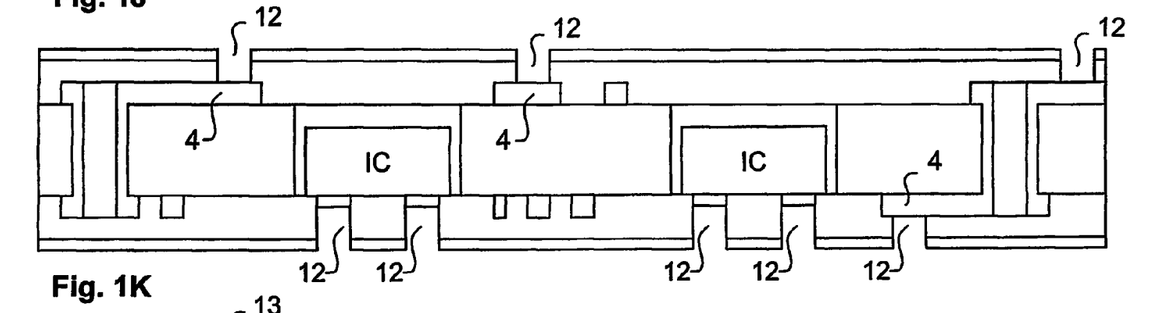

Stage K (FIG. 1K)

In stage K, holes 12 are made in the polymer film 10 (and at the same time in the conductive foil 11), through which it is possible to create contacts with the conductive patterns and feed-throughs (conductive material 4) of the circuit board and with the microcircuits 8.

The holes 12 can be made, for example, using a laser, or some other suitable method. The conductive patterns made in stage D, or the through holes made in stage B can be used for alignment.

Figure 1L:
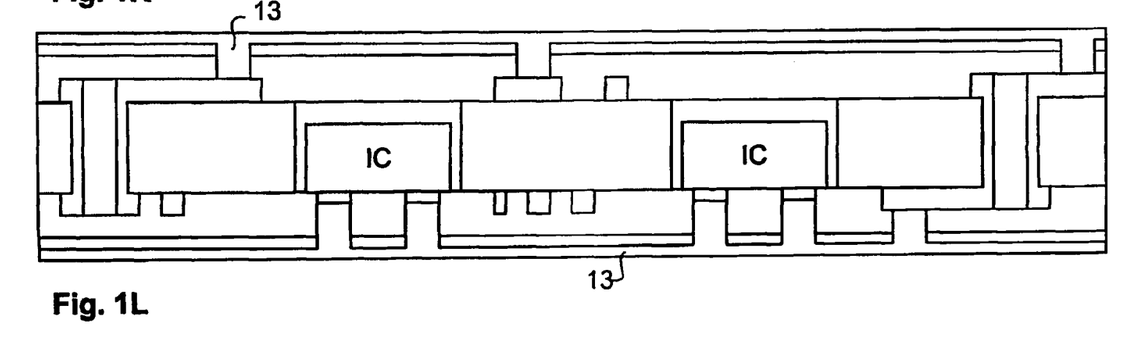

Stage L (FIG. 1L):

Stage L corresponds to stage C. In stage L, a conductive layer 13 is made in the holes 12 and on the surfaces of the circuit board.

In the example process, the feed-throughs (holes 12) are first of all cleaned using a three-stage desmear treatment. After this, the feed-throughs are metallized by first forming a catalysing SnPd surface on the polymer and after that depositing a thin layer (about 2 $\mu$m) of chemical copper onto the surface. The thickness of the copper 13 is increased by electrochemical deposition.

Alternatively, the feed-throughs can be filled with an electrically conductive paste or made using some other suitable micro-via metallizing method.

Figure 1M:
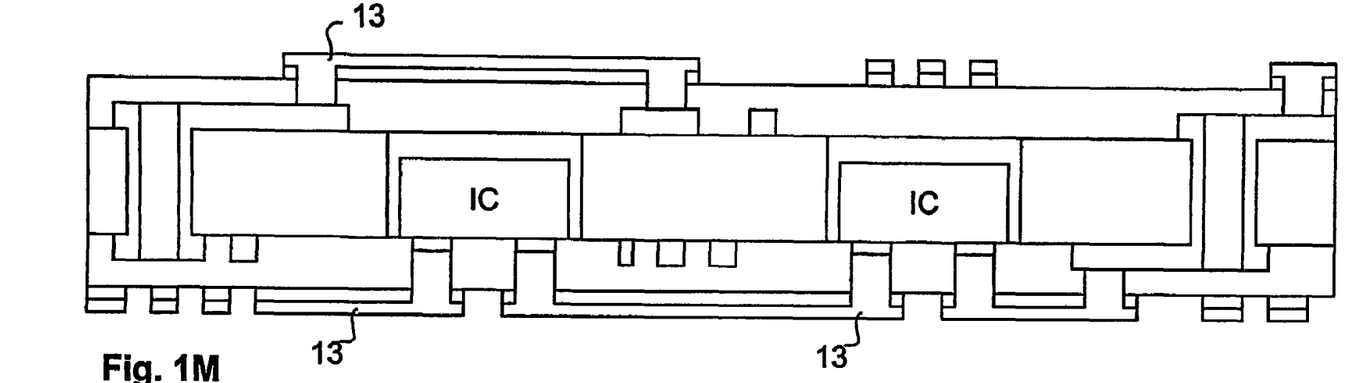

Stage M (FIG. 1M):

In stage M, a conductive pattern is formed in the same way as in stage D.

Figure 1N:
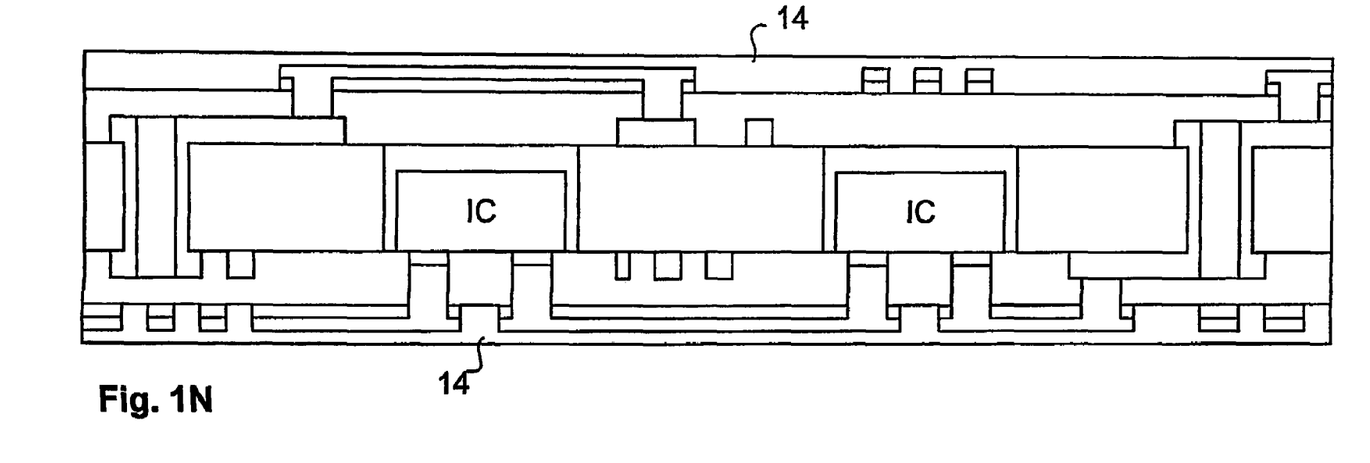
Figure 1O:
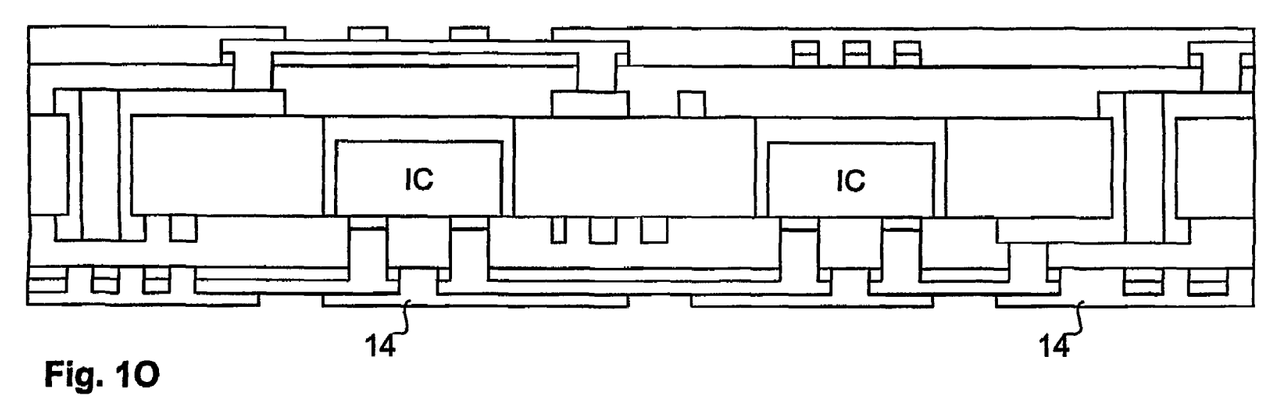

Stages N and O (FIGS. 1N and 1O):

In stages N and O, a photolitographic polymer 14 is spread on the surfaces of the circuit board and the desired pattern is formed in the polymer 14 (in a manner similar to that in stages D and M). The exposed polymer film is developed, but the polymer film pattern remaining on the circuit board is not removed.

Figure 1P:
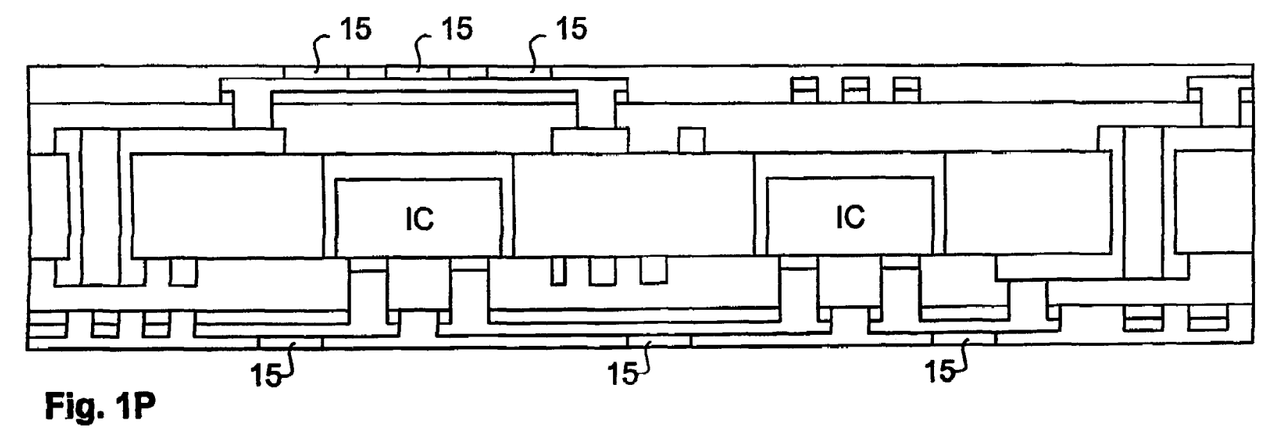

Stage P (FIG. 1P):

In stage P, the connection areas of the polymer film pattern formed in the previous stage are coated 15. The coating 15 can be made with, for example, a Ni/Au coating, or an OSP (organic surface protection).

The exemplary embodiment of FIG. 1 depicts one process, which can be used to exploit our invention. Our invention is thus in no way restricted to the process described above, but instead the invention covers a large group of different processes and their end products, to the full extent of the Claims and allowing for equivalency interpretations. In particular, the invention is in no way restricted to the layout shown in the exemplary embodiment of FIG. 1; instead, it will be obvious to one versed in the art that the processes according to our invention can be used to manufacture many kinds of circuit boards, which differ greatly from the examples disclosed here. Thus, the microcircuits and connections of the figures are only shown to illustrate the manufacturing process. Many changes can thus be made to the process of the example disclosed above, without deviating from the idea according to the invention. The changes can relate to the manufacturing techniques depicted in the various stages, or, for example, to the mutual sequence of the stages. For example, stage B can equally well be carried out after stage D, i.e. the procedure can include aligning the drill on the pattern, instead of aligning the pattern on the drilled holes.

Other necessary stages can also be added to the process of the example disclosed above. For example, a foil that protects the surface of the circuit board during the casting taking place in stage H can be laminated onto the first side (1a) of the circuit board. Such a protective foil is manufactured so that it covers all the other areas except for the holes 6. The protective foil keeps the surface of the circuit board clean when the casting epoxy is spread with the spatula. The protective foil can be made in a suitable stage before stage H and is removed from the surface of the circuit board immediately after the casting.

With the aid of the method, it is also possible to manufacture component packets to be attached to the circuit board. Such packets can also include several semiconductor components, which are connected electrically to each other.

The method can also be used to manufacture entire electrical modules. The process shown in FIG. 1 can also be applied in such a way that the conductive structure is made only on the second side (1b) of the circuit board, to which the contact surfaces of the microcircuit are oriented.

The method makes it possible to manufacture, for example, circuit boards or electrical modules, in which the thickness of the baseboard used is in the range 50–200 microns and the thickness of the microcircuit and microcircuits is in the range 50–150 microns. The pitch of the conductors can vary, for example, in the range 50–250 microns while the diameter of the micro-feed-throughs can be, for example, 15–50 microns. Thus, the total thickness of a single board in a one-layer construction will be about 100–300 microns.

The invention can also be applied in such a way that circuit boards are assembled on top of each other, thus forming a multi-layer circuit structure, in which there are several circuit boards manufactured according to the exemplary embodiment of FIG. 1 set on top of each other and connected electrically to each other. The circuit boards set on top of each other can also be circuit boards in which the conductive structure is formed only on the second side 1b of the circuit board, but which nevertheless include feed throughs, through which an electrical contact can also be formed to the microcircuits from the first side of the circuit board. FIG. 2 shows one such process.

FIG. 2 shows the connection of circuit boards to each other. In the following, the process is described in stages.

Figure 2A:
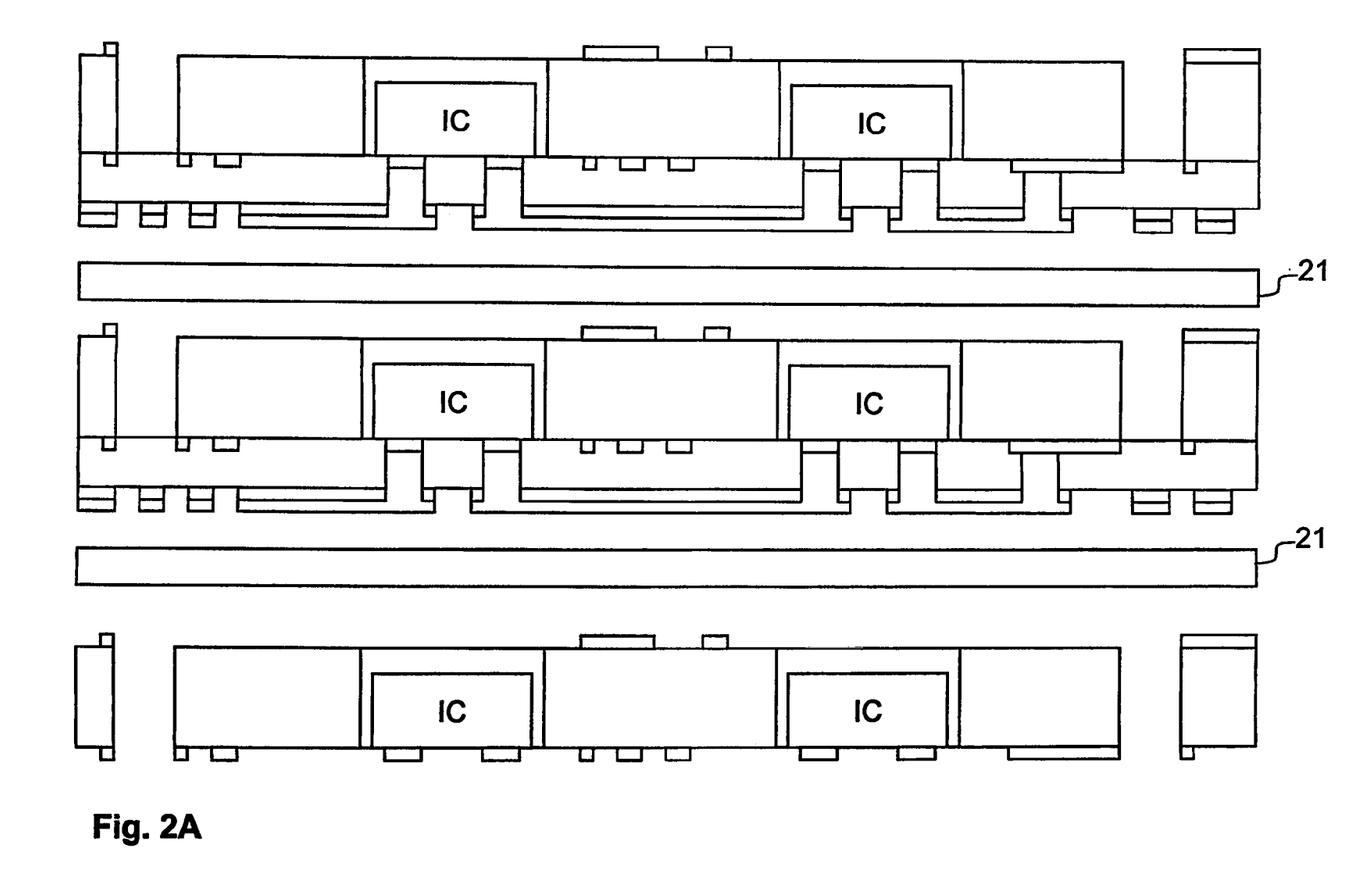

Stage 2A (FIG. 2A):

Stage 2A depicts the circuit boards being set on top of each other. The lowest circuit board can be obtained, for example, after stage I of a modified process of FIG. 1. In this case, the process of FIG. 1 is then modified by omitting stage 1C.

The middle and upper circuit boards in turn can be obtained after stage M of a modified process of FIG. 1, for instance. In this case, the process of FIG. 1 is modified by omitting stage 1C and performing stages J, K, and L on only the second side (1b) of the circuit board.

In addition to the circuit boards, FIG. 2A also shows pre-preg epoxy layers 21 placed between the circuit boards.

Figure 2B:
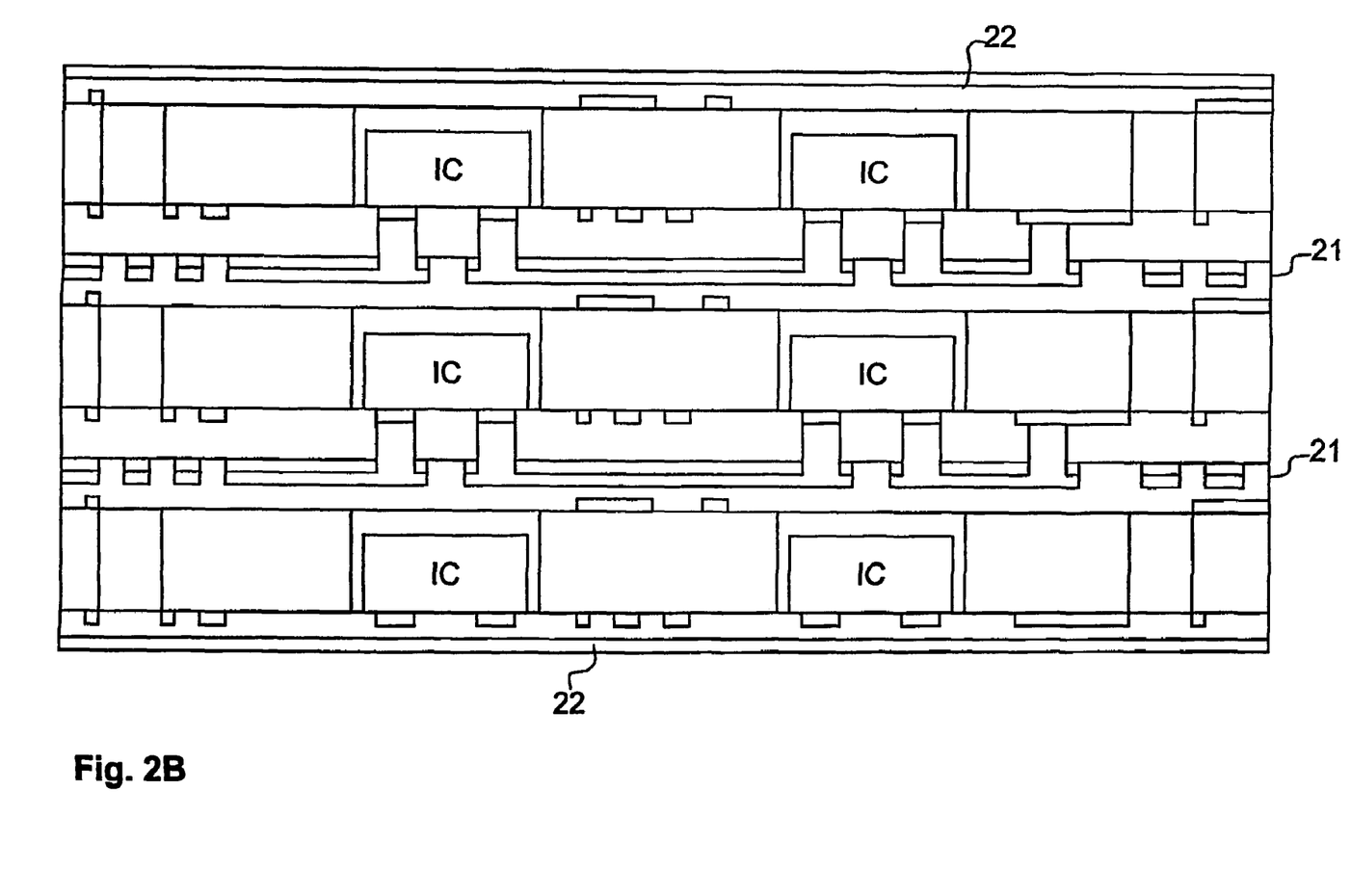

Stage 2B (FIG. 2B):

In stage 2B, the circuit boards are laminated together with the aid of pre-preg epoxy layers 21. In addition, a metal-coated polymer film 22 is made on both sides of the circuit board. The process corresponds to stage J of the process of FIG. 1.

Figure 2C:
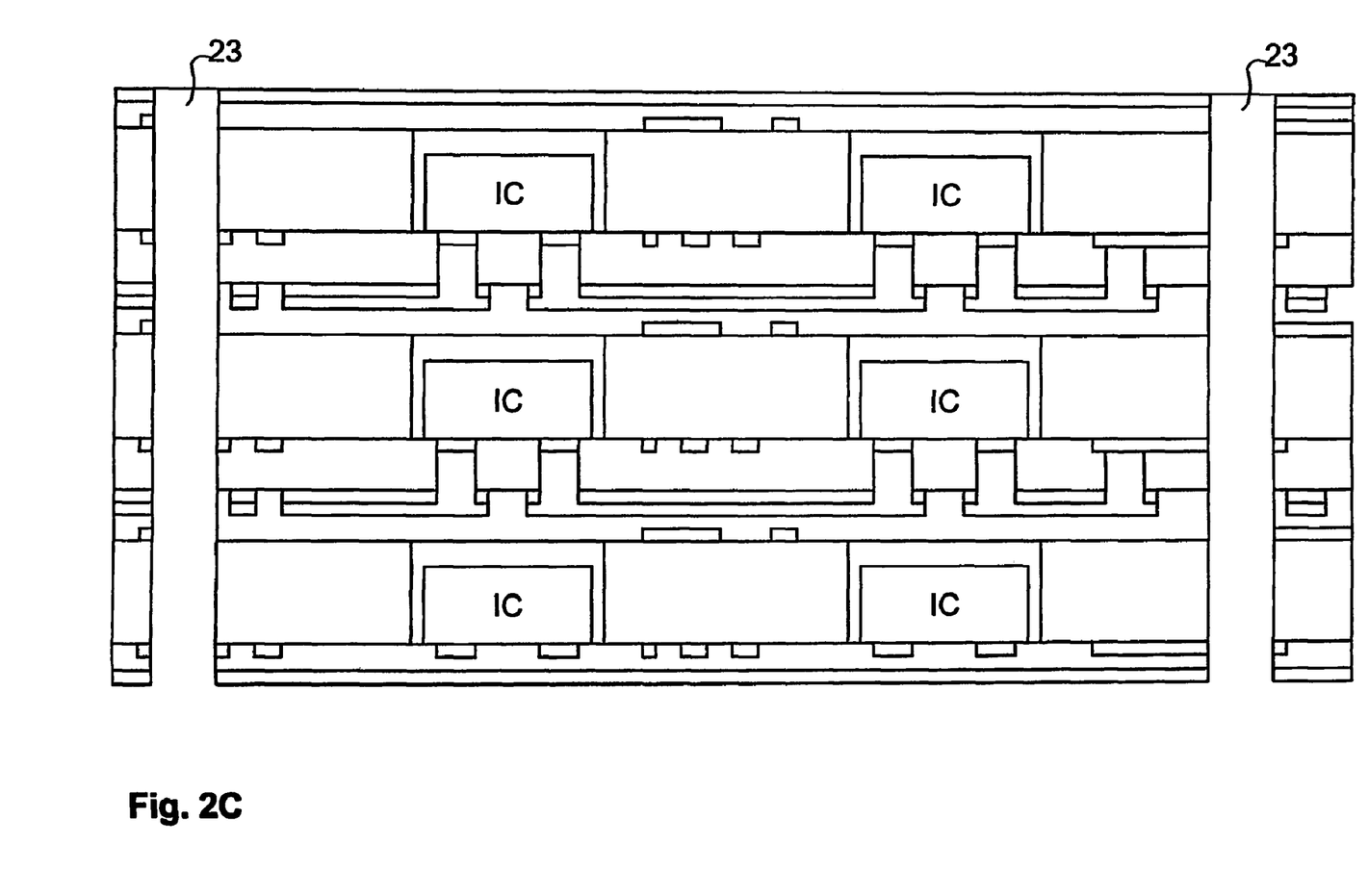

Stage 2C (FIG. 2C):

In stage 2C, holes 23, for the formation of contacts, are drilled in the circuit board.

After Stage 2C, the process can be continued for example as follows:

Stage 2D:

In stage 2D, conductive material is grown on top of the circuit board and in the through holes 23, in the same way as in stage 1C.

Stage 2E:

In stage 2E, the conductive layer on the surface of the circuit board is patterned in the same way as in stage 1D.

Stage 2F:

In stage 2F, a photolitographic polymer is spread on the surfaces of the circuit board and the desired pattern is formed in the polymer in the same way as in stages 1N and 1O. The exposed polymer film is developed, but the polymer film pattern remaining on the circuit board is not removed.

Stage 2G:

In stage 2G, the connection areas of the polymer film pattern formed in the previous stage are metallized in the same way as in stage 1P.

On the basis of the example of FIG. 2, it is obvious that the method can also be used to manufacture many kinds of three-dimensional circuit structures. For example, the method can be used in such a way that several memory circuits are placed on top of each other, thus forming a packet containing several memory circuits, in which the memory circuits are connected to each other to form an operational totality. Such a packet can be termed a three-dimensional multichip module. The chips in such modules can be selected freely and the contacts between the chips can be easily made according to the selected circuits.

Figure 3A:
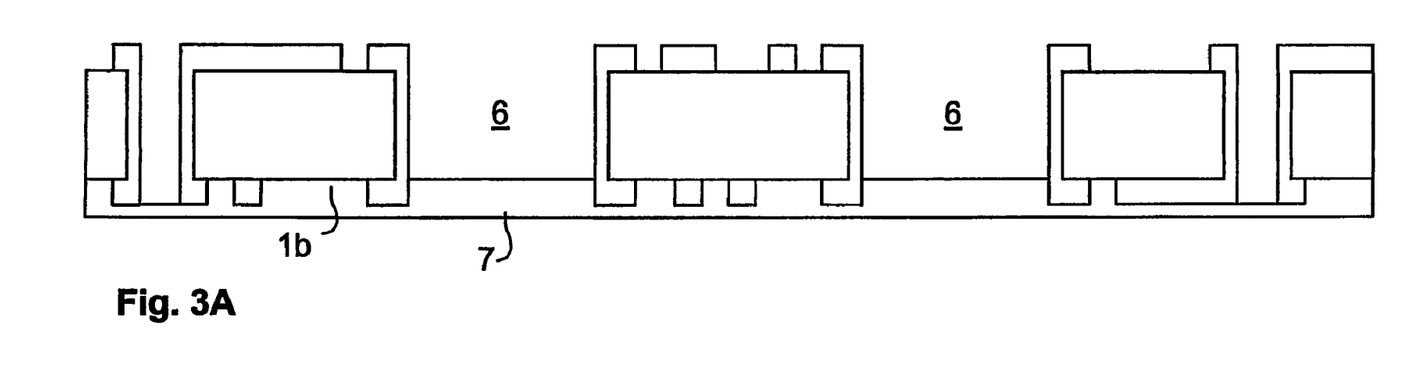

The invention also permits electromagnetic protection to be made around the component embedded in the base. This is because the method of FIG. 1 can be modified in such a way that the holes 6 depicted in stage 1E can be made in connection with the making of the holes 3 carried out in stage 1B. In that case, the conductive layer 4 to be made in stage 1C will also cover the side walls of the holes 6 made for the components. FIG. 3A shows a cross-section of the base structure as it is after stage 1F in the process modified in the aforesaid manner.

Figure 3B:
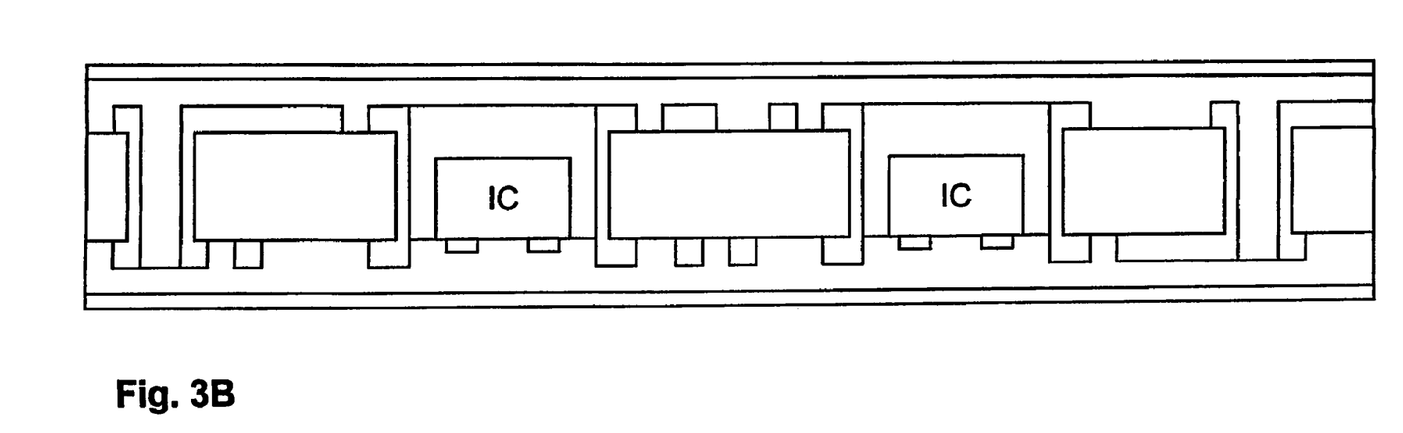

After the intermediate stage shown in FIG. 3A, the process can be continued by assembling the microcircuits in a similar way to stage 1G, the microcircuits being attached similarly to stage 1H, the tape removed similarly to stage 1I, and polymer and metal foils being made on both surfaces of the circuit board in a similar way to stage 1J. FIG. 3B shows an example cross-section of the base structure after these process stages.

Figure 3C:
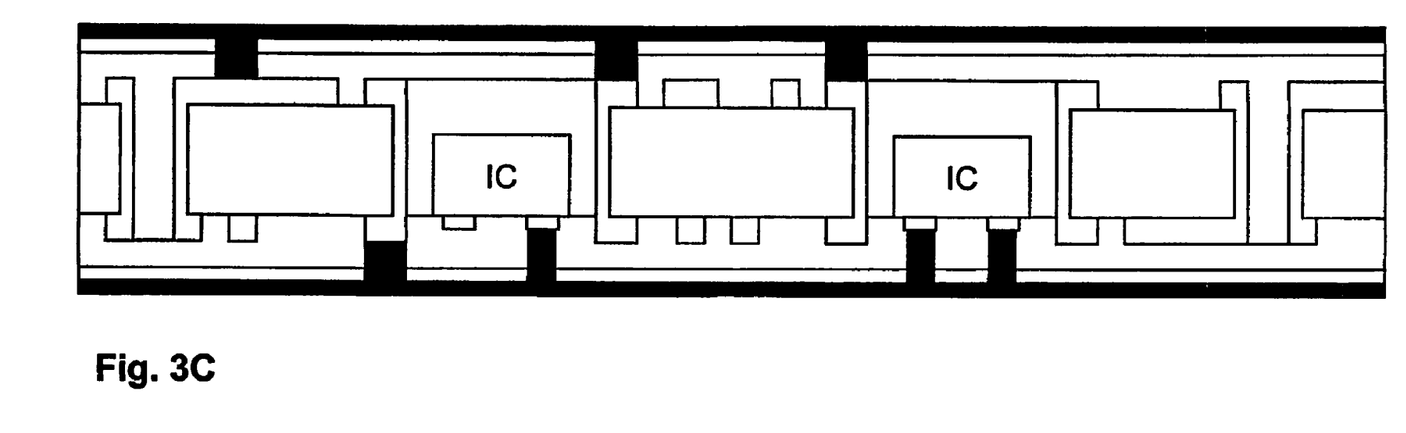

After the intermediate stage shown in FIG. 3B, the process can be continued by making holes, similar to those of stage 1K, in the polymer film, for making contacts. After this, a conductive layer is made in the holes and on the surfaces of the board similarly to stage 1L. FIG. 3C shows an example cross-section of the base structure after these process stages. For reasons of clarity, the conductive layer made similarly to stage 1L in the holes and on the board surfaces is highlighted in black.

Figure 3D:
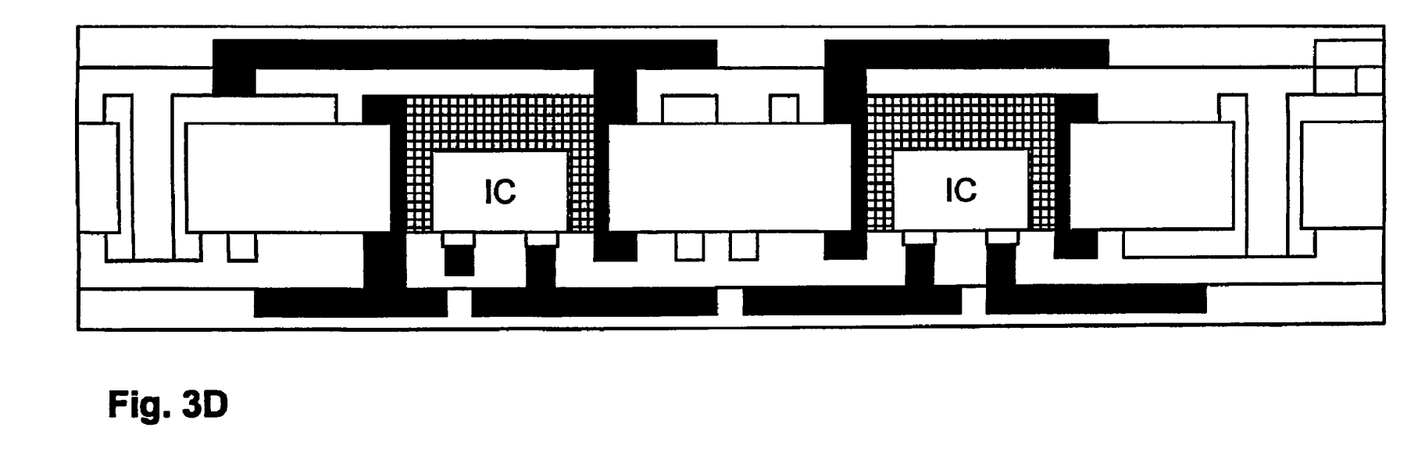

After the intermediate stage shown in FIG. 3C, the process can be continued by patterning a conductive layer on the surfaces of the board as in stage 1M and by coating the surfaces of the board as in stage 1N. After these stages, the microcircuits are surrounded by a nearly unbroken metal foil, which forms an effective protection against interference caused by electromagnetic interaction. This construction is shown in FIG. 3D. After the intermediate stage shown in FIG. 3D, stages corresponding to stages 1O and 1P are carried out, in which a protective foil and connections are made on the surface of the circuit board.

In FIG. 3D, the cross-sections of the metal layers protecting the microcircuits are highlighted in black. In addition, the background of the microcircuits is highlighted with cross-hatching. The cross-hatching is intended to be a reminder that all the sides of a hole made for a microcircuit are covered by a metal foil. Thus the microcircuit is surrounded laterally with an unbroken metal foil. In addition to this, a metal plate can be designed above the microcircuit, which is made in connection with the making of the circuit board's conductive pattern. Similarly, a metal foil that is as complete as possible is made below the microcircuit. The making of contacts below the microcircuit means that small gaps must be made in the metal foil, as shown in FIG. 3D, for instance. These gaps can, however, be made so narrow laterally, or, correspondingly, so thin vertically, that they do not weaken the protective effect obtained against electromagnetic interference.

When examining the example of FIG. 3D, it must also be take into account that the final structure also contains parts extending at right angles to the plane shown in the figure. Such a structure extending at right angles is shown by the conductor connected to the contact bump on the left-hand side of the left-hand microcircuit of FIG. 3D, which runs towards the viewer from between the metal foil surrounding the microcircuit laterally and the conductive layers below the microcircuit.

The solution shown by FIG. 3D thus provides the microcircuit with excellent protection against electromagnetic interference. As the protection is made immediately around the microcircuit, the construction also protects against mutual interference arising between the components contained in the circuit board. Most of the electromagnetic protective structure can also be earthed, as the metal foil surrounding the microcircuits laterally can be connected electrically to the metal plate above the circuit. The connections of the circuit board, can, in turn, be designed in such a way that the metal plate is earthed through the conductive structure of the circuit board.

What is claimed is:

1. A method for embedding a component in a base and for forming electrical contact with the component, the method comprising talking a baseboard as the base, making a hole in the baseboard, placing a component in the hole, the component having, on its first surface, contact areas or contact protrusions for creating electrical contacts, securing the component in place in the hole made in the baseboard, making an insulating layer on at least one of a first and second surface of the baseboard, in such a way that the insulating layer covers the component, making contact openings for the component in the insulating layer, and making conductors to the contact openings and on top of the insulating layer, in order to form electrical contacts with the component, characterized by making conductive patterns on the baseboard, selecting the position of the hole and aligning the component in relation to the conductive patterns made on the baseboard, and after making the hole laminating a tape or a tape-like film on the second surface of the baseboard, placing the component in the hole made in the baseboard from the first-surface side of the baseboard, so that the first surface of the component lies against the tape or tape-like film and is substantially on the same level as the second surface of the baseboard, securing the component in place in the hole made in the baseboard by filling the hole with a filler material, and after securing the component, removing the tape or tape-like film laminated on the second surface of the baseboard.

2. A method according to claim 1, in which the hole, which is made in the baseboard corresponding to the base of the component, is a through hole.

3. A method according to claim 2, in which conductive material is grown on the side walls of the hole made for a component, in order to create interference protection around the component.

4. A method according to any of claims 1–3, in which the component to be placed in the hole is a microcircuit.

5. A method according to claim 4, in which, after the securing of the microcircuit the tape or tape-like film laminated on the second surface of the baseboard is removed, an RCC foil is laminated onto the second surface of the baseboard, and conductive patterns and contact openings for the components are made in the RCC foil.

6. A method according to claim 4, in which holes are made for feed-throughs and, after the securing of the microcircuit the tape or tape-like film laminated on the second surface of the baseboard is removed, RCC foils are laminated onto the first and second surfaces of the baseboard, conductive patterns and contact openings for the component and feed-throughs are made in the RCC foil laminated onto the second surface of the baseboard, and conductive patterns and contact openings for the feed-throughs are made in the RCC foil laminated onto the second surface of the baseboard.

7. A method according to claim 4, in which, after the securing of the microcircuit the tape or tape-like film laminated on the second surface of the baseboard is removed, a pre-preg epoxy foil is made on the second surface of the baseboard, contact openings for the component are made in the epoxy foil, and conductive patterns are made on top of the epoxy foil.

8. A method according to claim 4, in which holes for feed-throughs are made in the base, and, after the securing of the microcircuit the tape or tape-like film laminated on the second surface of the baseboard is removed, pre-preg epoxy foils are laminated onto the first and second sides of the baseboard, contact openings for the component and feed-throughs are made in the epoxy foil of the second surface of the baseboard, and contact openings for the feed-throughs are made in the epoxy foil of the first surface of the baseboard.

9. A method according to any of claim 4–8, in which an electrical contact is formed with the microcircuit from the direction of the second surface of the baseboard, after the microcircuit has been placed in the hole made in the baseboard.

10. A method according to any of claims 4–9, in which an electrical contact is formed with the microcircuit by growing conductive material in the contact areas of the microcircuit, or on top of its contact protrusions.

11. A method according to any of claims 4–10, in which the electrical contact with the microcircuit is formed without solder using a circuit-board manufacturing technology.

12. A method according to any of claims 1–11, in which more than one component is embedded in the base in a corresponding manner.

13. A method according to claim 12, in which a separate hole is made in the baseboard for each component to be embedded in the base and each component to be embedded in the base is located in its own hole.

14. A method according to any of claim 1–13, in which at least two microcircuits are embedded in the base, and in which a conductive layer is grown, which is connected directly to the contact areas or contact protrusions of the at least two microcircuits, in order to connect the microcircuits electrically to each other to form an operational totality.

15. A method according to any of claims 1–14, in which a multi-layer structure is manufactured, in which there are at least four conductive layers on top of each other.

16. A method according to any of claims 1–15, in which a first base and at least one second base are manufactured and the bases are assembled and secured on top of each other in such a way that the bases are aligned in relation to each other.

17. A method according to any of claims 1–15, in which a first and a second base and an intermediate layer are manufactured, the second base is placed above the first base and the second base is aligned in relation to the first base, the intermediate layer is placed between the first and the second bases, and the first and second bases are laminated to each other with the aid of the intermediate layer.

18. A method according to claim 17, in which at least one third base and an intermediate layer for each third base are manufactured, each third base is placed in turn above the first and second bases and each third base is aligned in relation to one of the lower bases, an intermediate layer is placed beneath each third base, and the first, second, and each third base are laminated to each other with the aid of the intermediate layers.

19. A method according to any of claims 16–18, in which holes for feed-throughs are drilled through the bases secured on top of each other and conductors are made in the drilled holes for connecting the electronic circuits of each base to each other to form an operational totality.

20. A method according to any of claims 1–19, in which the temperature of the baseboard, component, and conductive layer connected directly to the component, is, during the process, less than 200° C. and preferably in the range 20–85° C.

21. An electronic module, which is manufactured using a method according to any of claims 1–20.

* * * * *

UNITED STATES PATENT AND TRADEMARK OFFICE
CERTIFICATE OF CORRECTION

PATENT NO. : 6,991,966 B2
APPLICATION NO. : 10/502340
DATED : January 31, 2006
INVENTOR(S) : Risto Tuominen It is certified that error appears in the above-identified patent and that said Letters Patent is hereby corrected as shown below:

In Claim 1, col. 8, line 63, change "talking" to --taking--

Signed and Sealed this

Eighth Day of August, 2006

JON W. DUDAS
*Director of the United States Patent and Trademark Office*